United States Patent [19]

Holley et al.

[11] 4,109,213

[45] Aug. 22, 1978

[54] DIGITAL AUTOMATIC GAIN AMPLIFIER

[76] Inventors: James C. Fletcher, Administrator of the National Aeronautics and Space Administration, with respect to an invention of Larry D. Holley, Merritt Island; James O. Ward, Titusville, both of Fla.

[21] Appl. No.: 780,729

[22] Filed: Mar. 24, 1977

[51] Int. Cl.² ............................ H03F 1/00; H03F 1/36
[52] U.S. Cl. ...................... 330/2; 324/99 D; 324/123 C; 330/51; 330/86
[58] Field of Search ............ 324/99 D, 123 C, 123 R, 324/130; 330/2, 51, 86

[56] References Cited

U.S. PATENT DOCUMENTS

| | | | |
|---|---|---|---|
| 3,159,787 | 12/1964 | Sexton et al. | 324/123 R X |
| 3,539,936 | 11/1970 | McGhee | 330/29 |
| 3,760,287 | 9/1973 | Harris | 330/51 X |

*Primary Examiner*—Lawrence J. Dahl

*Attorney, Agent, or Firm*—James O. Harrell; John R. Manning

[57] ABSTRACT

A circuit for adjusting the amplitude of a reference signal to a predetermined level so as to permit subsequent data signals to be interpreted correctly. The circuit includes an operational amplifier having a feedback circuit connected between an output terminal and an input terminal; a bank of relays operably connected to a plurality of resistors; and a comparator comparing an output voltage of the amplifier with a reference voltage and generating a compared signal responsive thereto. Means is provided for selectively energizing the relays according to the compared signal from the comparator until the output signal from the amplifier equals to the reference signal. A second comparator is provided for comparing the output of the amplifier with a second voltage source so as to illuminate a lamp when the output signal from the amplifier exceeds the second voltage.

6 Claims, 1 Drawing Figure

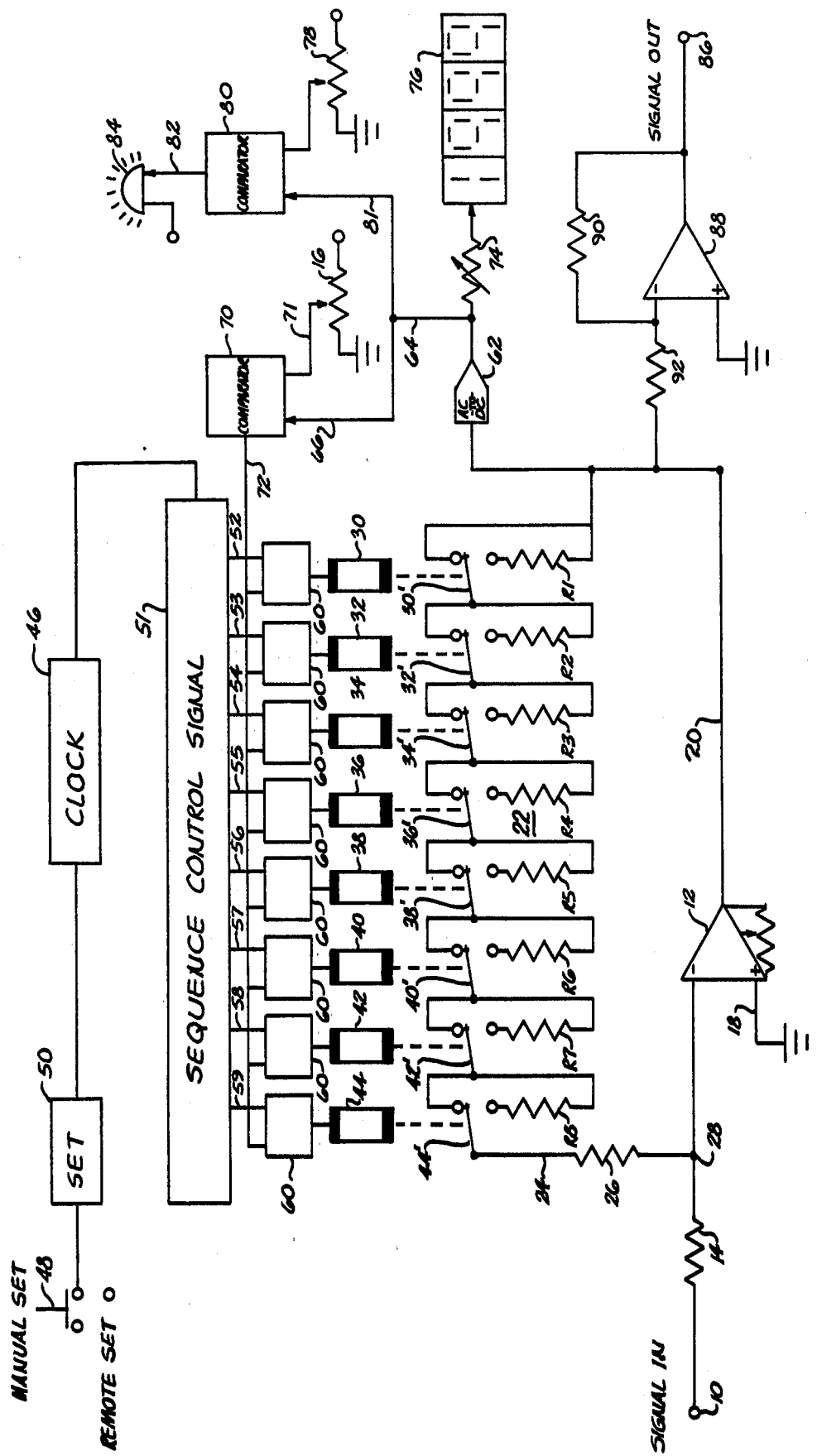

DIGITAL AUTOMATIC GAIN AMPLIFIER

ORIGIN OF THE INVENTION

The invention described herein was made in performance of work under a NASA contract and is subject to the provisions of Sections 305 of the National Aeronautics and Space Act of 1968, Public Law 85-568 (72 Stat. 435, 402 USCP 2457).

BACKGROUND OF THE INVENTION

The present invention relates to a digital automatic gain amplifier, and more particularly to a device for adjusting the amplitude of a reference signal to a predetermined level so as to permit subsequent data signals to be interpreted correctly.

A variable gain amplifying apparatus wherein the output of an amplifier may be veried by means of digital signals is disclosed in U.S. Pat. No. 3,470,487 granted to P. J. Lukas et al, on Sept. 30, 1969. Another automatic range changing circuit for attenuating stepwise the voltage output of a-current-to-volts amplifier is disclosed in U.S. Pat. No. 3,539,936 granted to John D. McGhee. Both of these devices teach varying the resistance in the feedback loop by means of electronic circuitry such as transistor switches. Normally, prior to analyzing signals stored on tapes the analyzing equipment being used has to be calibrated so that a calibration reference signal which preceded the data signals produces a predetermined voltage. Heretofore, usually this required manual adjustment by means of potentiometers, which was time consuming.

SUMMARY OF THE INVENTION

The invention includes an apparatus for adjusting the amplitude of a reference signal to a predetermined level so as to permit subsequent data signals to be interpreted correctly. The apparatus includes an operational amplifier which has a feedback circuit connected between an output terminal and an input terminal. A plurality of relays are used for selectively placing respective resistors in said feedback circuit upon being energized. A comparator is connected to the output of the operational amplifier for comparing the output voltage with a reference voltage and generating a compared signal responsive thereto. This compared signal is fed to a logic circuit, which in turn, automatically energizes and de-energizes the relays for placing different resistors in the feedback circuit until the output voltage of the operational amplifier equals a reference voltage.

Accordingly, it is an important object of the present invention to provide an apparatus for adjusting an operational amplifier until a calibration reference signal produces a predetermined output signal.

Still another important object of the present invention is to provide an apparatus which can be automatically adjusted so that a calibration signal from a tape or the like produces an output voltage of a predetermined value.

These and other objects and advantages of the invention will become apparent upon reference to the following specification, attendant claims and drawing.

BRIEF DESCRIPTION OF THE DRAWING

The drawing illustrates in block form an apparatus including an operational amplifier for adjusting a calibration reference signal to a predetermined level.

DESCRIPTION OF A PREFERRED EMBODIMENT

In analyzing signals carried on magnetic tapes such as acoustic data, normally a calibration signal of a predetermined voltage is placed on the tape prior to recording the acoustic data. When reproducing this signal or this information so that such can be analyzed, it is necessary to set the gain of the equipment being used to analyze the signal with a reference voltage. Normally this is accomplished by adjusting potentiometers for varying the gain of an amplifier until an output signal produced by the calibration reference signal is equal to the predetermined voltage.

In the device constructed in accordance with the present invention a signal which is to be analyzed is applied to an input terminal 10 of an operational amplifier 12 through a resistor 14. This input signal may be taken off of a tape and prior to analyzing the remaining information carried on the tape, it is necessary to vary the gain of the operational amplifier 12 until the output voltage produced by the operational amplifier is equal to a given reference voltage, such as produced by a reference voltage source 16.

The operational amplifier 12 may be any suitable conventional operational amplifier which has one terminal grounded as by lead 18. The feedback loop of the operational amplifier includes lead 20, the resistive network generally designated by the reference character 22, lead 24, and resistor 26. The feedback loop is connected through junction 28 back to the input of the operational amplifier 12. By varying the number of resistors R1 through RN that are inserted in the feedback loop the gain of the operational amplifier can be adjusted until the output voltage produced by the calibration signal is equal to the reference voltage source 16. The gain produced by the operational amplifier 12 is equal to the feedback resistance divided by resistor 14.

The feedback loop extending between the output of the operational amplifier 12 and the input terminal 28 is in the form of a straight line extending through the resistance network 22. This is because all of the relays 30 through 44 are de-energized and accordingly, none of the resistors R1 through RN are in the feedback loop. In one particular embodiment the resistive value of resistor R1 is twice that of resistor R2, and each of the succeeding resistors is half the value of the preceding resistor. Therefore, by automatically and selectively placing the various valued resistors R1 through RN into the feedback circuit of the operational amplifier, the gain of the operational amplifier can be adjusted.

The apparatus is controlled by a clock 46 which when turned on by a manual pusbutton 48 through a set circuit 50 is activated to produce a plurality of pulses on its output. It is to be understood, of course, that the clock 46 could be remotely turned on by any suitable remote control system. The clock pulses generated by the clock 46 are, in turn, fed to a sequence control circuit which generates a signal on output leads 52 through 59 in sequence. These signals are fed through a respective logic control circuit 60 to a respective relay 30 through 44. As the signals are sequentially placed on the output terminals 52 through 59 they, in turn, energize the relays 30 through 44. For example, the first signal when applied to lead 52 passes through the logic circuit 60 which may be any suitable logic circuit to energize relay 30. When relay 30 is energized, contact 30' is shifted so as to place resistor R1 in the feedback loop.

This, in turn, causes the gain of the operational amplifier 12 to increase in voltage.

The output voltage of the operational amplifier is fed through an AC-to-DC converter 62 through lead 64 to one input 66 of a comparator 70. Another input 71 of the comparator 70 is connected to the reference voltage source 16. If the signal appearing on input lead 66 exceeds the voltage of the reference voltage 16 then a compared signal is produced on output terminal 72 of the comparator and fed back to the logic circuit 66 for causing relay 30 to be again de-energized removing resistor R1 from the feedback circuit.

The next sequential pulse produced by the sequence control circuit 51 causes relay 32 to be energized and the cycle of comparing the output signal from the operational amplifier 12 by the comparator 70 with reference voltage is repeated. If the output signal from the operational amplifier 12 exceeds the voltage of the reference voltage source 16, then resistor 32 is removed from the feedback network and on the next cycle resistor 34 is placed therein. This cycle is repeated until the output voltage of the operational amplifier 12 equals the voltage of the reference voltage source 16.

If, on the other hand, the output voltage for the operational amplifier 12 is less than the reference voltage source 16, then the particular resistor R1 through RN which was placed in the feedback circuit by energizing one of the relays 30 through 44 is left in the feedback circuit and the next sequential pulse produced by the sequence control circuit 51 energizes the next relay. The gating of the signals from the sequence control circuit 51 and the comparator takes place through the logic circuit 60 which may be any suitable logic circuit to perform such a function. The output of the AC-to-DC converter 62 is also fed through an adjustable pot 74 for being fed into a digital panel meter 76. The digital panel meter 76 produces a visual indication as to the value of the output voltage of the operational amplifier 12.

After the system is set, if the output of the operational amplifier exceeds a predetermined voltage level, such as set by the voltage source 78, then a comparator 80 compares this overvoltage signal coming in on lead 81 with the voltage source 78 and generates an overscale signal. This overscale signal is used for illuninating signal lamp 84.

In order to produce a low impedance from the circuit on output terminal 86, the output signal from operational amplifier 12 is fed through an operational amplifier 88 which is similar in construction to the operation of amplifier 12. The operational amplifier 88 has a feedback loop 90 provided therewith as well as an input resistor in its input circuit 92.

While a preferred embodiment of the invention has been described using specific terms, such description is for illustrative purposes only, and it is to be understood that changes and variations may be made without departing from the spirit or scope of the following claims.

What is claimed is:

1. An apparatus for adjusting the amplitude of a reference signal to a predetermined level so as to permit subsequent data signals to be interpreted correctly, said apparatus comprising:
   (a) an operational amplifier;
   (b) a feedback circuit connected between an output terminal and an input terminal of said operational amplifier;
   (c) a plurality of resistors;
   (d) a reference voltage source;
   (e) a comparator comparing an output voltage of said amplifier with said reference voltage and generating a compared signal;
   (f) a bank of relays;
   (g) each of said relays operably connected to a respective resistor of a plurality of resistors;
   (h) means for selectively energizing said relays according to said compared signal from said comparator for connecting selected ones of said resistors in said feedback circuit until said output signal from said amplifier equals said reference voltage;
   (i) said means for selectively energizing said relays including:
      (i) a sequence control circuit having a plurality of output terminals,
      (ii) means for enabling said sequence control circuit sequencially generating a signal on said plurality of output terminals,
      (iii) a plurality of logic control circuits each of which is connected between a respective output terminal of said sequence control circuit and a respective relay for energizing a respective relay responsive to receiving a signal from said sequence control circuit, and
      (iv) means for applying said compared signal to said logic control circuits for deenergizing said relays when said output voltage of said amplifier exceeds said reference voltage.

2. The apparatus as set forth in claim 1 further comprising:
   (a) an AC-to-DC converter connected between the output of said amplifier and said comparator for converting an AC signal produced by said amplifier to a DC signal to be compared with said reference voltage source in said comparator.

3. The apparatus as set forth in claim 2 further comprising:
   (a) a digital panel meter connected to the output of said AC-to-DC converter for producing a visual indication as to the value of the output voltage of said amplifier.

4. The apparatus set forth in claim 3 further comprising:
   (a) a second comparator;
   (b) a lamp connected to the output of said comparator;
   (c) a second reference voltage source connected to said second comparator;
   (d) means for connecting said DC signal produced by said AC-to-DC converter to said second comparator;
   whereby when said DC signal exceeds said second reference signal said lamp is illuminated.

5. An apparatus for adjusting the amplitude of a reference signal to a predetermined level so as to permit subsequent data signals to be interpreted correctly, said apparatus comprising:
   (a) an operational amplifier;
   (b) a feedback circuit connected between an output terminal and an input terminal of said operational amplifier;
   (c) a plurality of resistors;
   (d) a reference voltage source;
   (e) a comparator comparing an output voltage of said amplifier with said reference voltage and generating a compared signal;
   (f) a bank of relays;

(g) each of said relays operably connected to a respective resistor of said plurality of resistors;
(h) means for selectively energizing said relays according to said compared signal from said comparator until said output signal from said amplifier equals said reference voltage.
(i) a second comparator;
(j) a lamp connected to the output of said comparator;
(k) a second reference voltage source connected to said second comparator; and
(l) means for connecting said DC signal produced by said AC-to-DC converter to said second comparator;

whereby when said DC signal exceeds said second reference signal said lamp is illuminated.

6. The apparatus as set forth in claim 5 further comprising:
(a) a display panel connected to the output of said amplifier for producing a visual indication of the output voltage being produced by said amplifier.

* * * * *